June 11, 1963 H. T. MANN 3,093,754

SUPERCONDUCTOR AND GATE EMPLOYING SINGLE
ELONGATED, SIMPLY CONNECTED THIN
FILM AS GATE ELEMENT

Filed June 3, 1960

HORACE T. MANN
*INVENTOR.*

BY Jerry A. Dinardo
AGENT

Albert Rosen
ATTORNEY.

3,093,754

SUPERCONDUCTOR AND GATE EMPLOYING SINGLE ELONGATED, SIMPLY CONNECTED THIN FILM AS GATE ELEMENT

Horace T. Mann, Palos Verdes, Calif., assignor to Space Technology Laboratories, Inc., Los Angeles, Calif., a corporation of Delaware Filed June 3, 1960, Ser. No. 33,721
15 Claims. (Cl. 307—88.5)

This invention relates generally to superconductive control arrangements, and has particular reference to a novel gating circuit utilizing thin superconductive films to control the flow of electrical currents.

One type of gating circuit that enjoys wide use in computer logical circuitry is known as an "and" gate. An "and" gate is a switching device in which a primary or "gate" current flowing in a gating circuit (the circuit to be controlled) may be interrupted by the simultaneous occurrence of secondary currents (control currents) flowing in two or more control circuits, each control current being incapable, by itself, of interrupting the flow of gate current.

Presently known "and" gates which utilize thin superconductive films suffer from certain disadvantages, one of these being the fact that each control current magnitude must be strictly maintained within narrow limits. Thus, if one of the control currents is too high it will of itself exercise control over the gate current, or if all of the control currents are too low, the combined effect of the control currents will be insufficient to provide the desired control. Another drawback of known gating devices is that they promote the introduction of spurious currents in the gated circuit.

Accordingly, it is an object of this invention to provide a superconductive current control arrangement that permits relatively wider tolerances in the magnitudes of the control currents.

A further object of this invention is to provide a superconductive gating device that inhibits the introduction therein of spurious currents.

The foregoing and other objects are realized in an "and" gate structure made up of a novel arrangement of thin film superconductive gate and control circuits. A single, "simply" connected gate element is provided with a pair of spaced terminals which define a path of current flow through the gate element. A region is "simply" connected when every closed curve within it encloses only points of the region. A region that is not simply connected is called "multiply" connected. Thus a solid sheet without holes is simply connected, while a sheet provided with one or more holes is "multiply" connected.

Two control members are mounted adjacent to the gate element. A first control member is oriented in such a manner with respect to the gate element that when the control member is energized by a control current, a magnetic field is created about a first portion of the gate element. The magnetic field has a magnitude sufficient to effect a change in this first gate portion from a superconducting to a resistive state, this first gate portion extending only part way across the path of the gate current. Similarly, the second control member is oriented to subject a second portion of the gate element to a magnetic field of sufficient magnitude to effect a change in this second gate portion from a superconducting to a resistive state. The second gate portion extends only part way across the gate current path and at least across the portion not covered by said first gate portion. In one embodiment the two control members take the form of films that adjoin each other in non-overlapping, side-by-side adjacency, and when both control members are energized, the gate portions together form a region of electrical resistance that extends all the way across the gate current path, thereby preventing the flow of gate current. Such an arrangement thus provides an "and" gate, since it is only when current flows through both the first and the second control members that gate current is prevented from flowing.

Since the arrangement of the invention is predicated upon certain effects peculiar to the phenomena of superconductivity, these effects will be discussed prior to a discussion of embodiments of the invention.

At temperatures near absolute zero some materials apparently lose all resistance to the flow of electrical current and become what appear to be perfect conductors of electricity. This phenomenon is termed superconductivity and the temperature at which the change occurs, from a normally resistive state to the superconducting state, is called the transition temperature. For example, the following materials have transition temperatures, and become superconducting, as noted:

| | ° Kelvin |
|---|---|
| Niobium | 8 |
| Lead | 7.2 |
| Vanadium | 5.1 |
| Tantalum | 4.4 |
| Mercury | 4.1 |
| Tin | 3.7 |
| Indium | 3.4 |
| Thallium | 2.4 |
| Aluminum | 1.2 |

Only a few of the materials exhibiting the phenomenon of superconductivity are listed above. Other elements, and many alloys and compounds, become superconducting at temperatures ranging between 0° and around 20° Kelvin. A discussion of many such materials may be found in a book entitled "Superconductivity" by D. Schoenberg, Cambridge University Press, Cambridge, England, 1952.

The above-listed transition temperatures apply only where the materials are in a substantially zero magnetic field. In the presence of a magnetic field the transition temperature is decreased. Consequently, in the presence of a magnetic field a given material may be in an electrically resistive state at a temperature below the absence-of-magnetic-field or normal transition temperature. A discussion of this aspect of the phenomenon of superconductivity may be found in U.S. Patent 2,832,897, entitled "Magnetically Controlled Gating Element," granted to Dudley A. Buck.

In addition, the above-listed transition temperatures apply only in the absence of electrical current flow through the material. When a current flows through a material, the transition temperature of the material is decreased. In such a case the material may be in an electrically resistive state even though the temperature of the material is lower than the normal transition temperature. The action of a current in lowering the temperature at which the transition occurs (from a state of normal electrical resistivity to one of superconductivity) is similar to the lowering of the transition temperature by an external magnetic field, inasmuch as the flow of current itself induces a magnetic field.

Accordingly, when a material is held at a temperature below its normal transition temperature for a zero magnetic field, and is thus in a superconducting state, the superconducting condition of the material may be extinguished by the application of an external magnetic field or by passing an electric current through the material.

Figure 1:
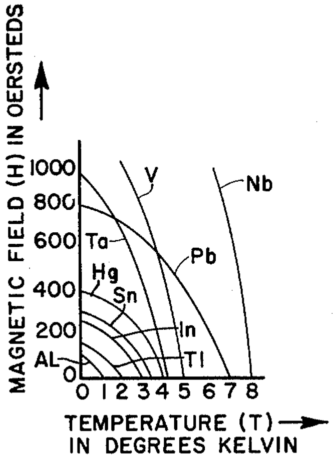
FIG. 1 is a graph illustrating the variations in transition temperature for various superconducting materials as a function of the magnetic field to which they are subjected.

FIG. 1 illustrates the variation in transition temperatures (T) for several materials as a function of an applied magnetic field. In the absence of a magnetic field, the point at which each of the several curves intercepts the abscissa is the transition temperature at which the material becomes superconducting. (The transition temperature for each material varies almost parabolically with the magnetic field applied to it, as expressed by the function $$\frac{H_c}{H_o}=1-\left(\frac{T}{T_c}\right)^2$$

where $H_c$ is the critical magnetic field density for effecting a transition from the superconducting to the resistive state at any given temperature T, $H_o$ is the intercept of a curve on the ordinate axis, at zero degrees Kelvin, and $T_c$ is the transition temperature of the material in the absence of a magnetic field). The transition temperature is given in degrees Kelvin. A particular material is superconducting for values of temperature and magnetic field falling beneath its curve, while for values of temperature and magnetic field falling above the curve, the material possesses electrical resistance.

Since a current flowing in the material has an effect upon the transition temperature that is similar to the effect of a magnetic field, the passage of a current through superconductive materials will yield curves similar to those shown in FIG. 1.

Figure 2:
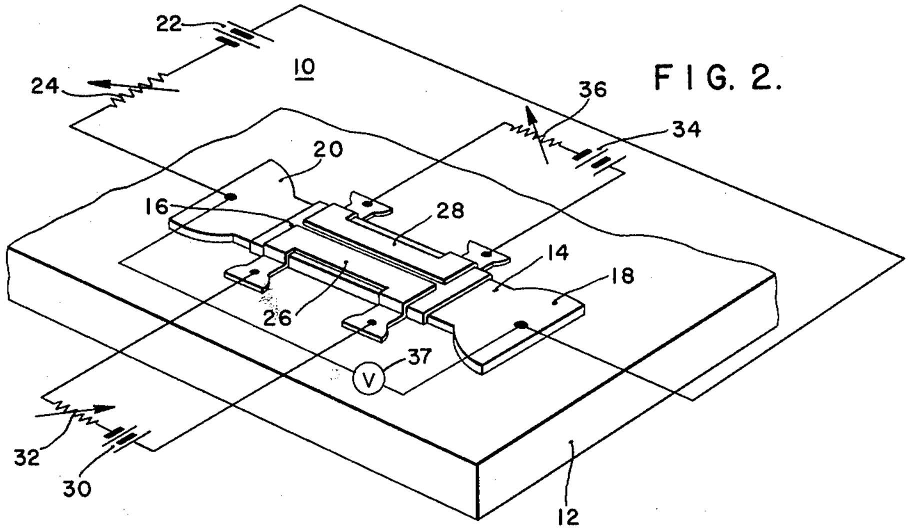
FIG. 2 is a perspective view, partly diagrammatic and partly schematic, of a gating device constructed according to the invention.

FIG. 2 shows one form of gating device 10 constructed in accordance with the invention. The gating device 10, also referred to herein as an "and" gate, and combinations thereof may be used to perform many of the logical functions well known to those skilled in the computer art. For example, it may be used in the various ways described in the aforementioned Buck Patent 2,832,897.

The gating device 10 comprises an insulating substrate 12, such as a sheet of glass, supporting on a surface thereof a single elongated, thin film superconductive gate element 14 that is simply connected, i.e. having no holes in it. The major body portion of the gate element 14 is covered with a thin insulation film 16, such as a vacuum deposited coating of silicon monoxide, or of a polymerized in situ organic silicone material such as polydimethylsiloxane. (Such a polymerized in situ film may for example be made by subjecting the element to be covered with insulation to electron bombardment in an environment of a silicone oil vapor, the electron beam creating a solid polymer film on the element.) The silicon monoxide insulation film should be at least about 1000 angstrom units in thickness in order to avoid pinholing, while the polymerized in situ film should be at least about of the order of 50 angstrom units in thickness for the same purpose. The superconductive gate element 14, when made of vacuum deposited tin or indium, is preferably thinner than of the order of 2500 angstrom units in thickness in order that it may exhibit the desired switching characteristics. Two widened ends 18 and 20 of the gate element 14 are not coated with the insulation film in the process of fabricating the element (e.g. by vapor deposition) in order that the gate element 14 may later be connected in series with a voltage source 22 and a variable resistor 24; the latter is controllable to pass a desired level of current, through the gate element 14, that is below the critical current level of the gate element 14. The critical current level of the gate element 14 is a function of (*a*) the material from which it is made, (*b*) the width and thickness dimensions of the element, and (*c*) the temperature of operation of the element.

In accordance with the invention, a pair of elongated thin film superconductive control members 26 and 28 are mounted in spaced-apart, nonoverlapping side-by-side adjacency on the insulation film 16. The control members 26 and 28 are each shaped in the general form of a U. The members 26 and 28 are disposed across the gate element 14 and with the base of one U closely spaced from the base of the other U, the U's being oppositely oriented. One of the control members 26 is connected in series with a voltage source 30 and variable resistor 32, the latter being controllable to pass a desired level of current through the control element 26. Similarly the other control member 28 is connected in series with a voltage source 34 and a variable resistor 36.

The current that is caused to flow through each of the control members 26 and 28 is of a magnitude that is sufficient of itself, in the absence of gate current flow, to induce a transition in portions of the gate element 14 directly in register with the control members 26 and 28. As will be described in greater detail, each control member is arranged to transform a separate portion of the gate element 14. When both control members 26 and 28 are energized, the two gate element portions thereby transformed combine to produce a resistive barrier to impede the flow of gate current. The resistive barrier is broken when either one or both of the control members 26 and 28 are de-energized, thereby permitting the gate current to flow unimpeded. A voltage sensing device 37 connected across the terminals of the gate element 14 senses the presence or absence of resistance in the gate element 14. A current is caused to flow through the gate element 14 by the source voltage 22. When a superconducting path exists through the gate element 14, no voltage will be developed across the gate element 14. When no superconducting path exists, as when both portions of the gate element 14 are resistive, the current flow will cause a potential drop across the gate element 14, and a voltage will be sensed by the sensing device 37.

In order that the flow of current through each control member be capable of generating a magnetic field that is sufficient to induce transitions in the gate element 14 without inducing a transition in the control member itself, the control members 26 and 28 and gate element 14 are preferably made of different superconductive materials. (Alternatively, the control members 26 and 28 may be made appreciably thicker than the gate element 14 to accomplish the same result.) The material of the control members 26 and 28 desirably has a much higher transition temperature than the material of the gate element 14. Suitable materials for the control members 26 and 28 are lead or niobium, while tin or indium may be used for the gate element 14.

In the operation of the gating device 10 as an "and" gate, the device 10 is maintained at a temperature just below the transition temperature of the gate element 14 and well below the transition temperature of the control members 26 and 28. The particular operating temperature is determined by the amount of gate current to be controlled, it being a necessary condition that the gate element 14 be maintained superconducting while gate current is flowing and while both of the control members 26 and 28 are de-energized.

Figure 3:
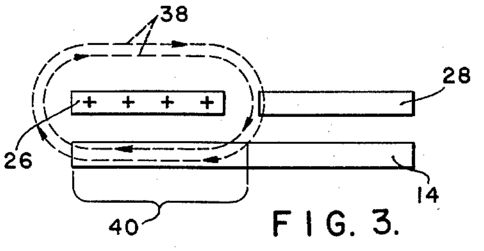
FIGS. 3, 4, and 5 are diagrammatic views illustrating the action of magnetic fields on the gating device of FIG. 2.

When only one of the control members, say member 26, is energized by causing current to flow through the member 26 from the source 30, a magnetic field is created around the control member 26. In FIG. 3, the magnetic field lines of force surrounding the control member 26 are exemplified by arrows 38, as the device 10 is viewed through a section taken across the width of the gate element 14 and through the base portions of the U-shaped control members 26 and 28. If the current through the control member 26 has a direction going away from the observer, the lines of force 38 will have a clockwise direction, as shown.

A sufficient magnitude of current is caused to flow through the control member 26 so that a magnetic field can be generated with sufficient intensity to cause a portion of the gate element 14 lying underneath the control member 26 to transform from the superconducting to the resistive state. By proper positioning of the control member 26 relative to the gate element 14 and by adjustment of the magnitude of the current therethrough, the portion transformed, indicated at 40, is limited to a region extending along the width of the gate element 14, from one edge of the gate element 14 to a point beyond the middle of the gate element 14 but short of the other edge of the gate element. The portion of the gate element 14 that remains superconducting provides a superconducting path along which the gate current can flow. Thus, no blocking of gate current occurs when the control element 26 alone is energized.

Figure 4:
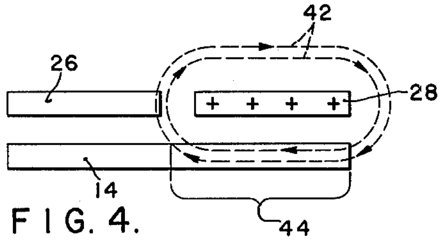

Similarly, when the other control member 28 alone is energized from the source 34, a magnetic field, exemplified in FIG. 4 by arrows 42, is created around the member 28. The placement of the control member 28 and the magnitude of control current are arranged such that the resulting magnetic field 42 causes a transition at least in that portion of the gate element 14 not transformed by the first generated magnetic field 38. The gate element portion 44 transformed by the second magnetic field 42 may overlap the first portion 40 to some extent, but in no event should it extend across the entire width of the gate element 14. Thus, in the case where the first control member 26 alone was energized, energizing the second control member 28 alone will leave a portion of gate element 14 superconducting to provide a path for gate current flow.

Figure 5:
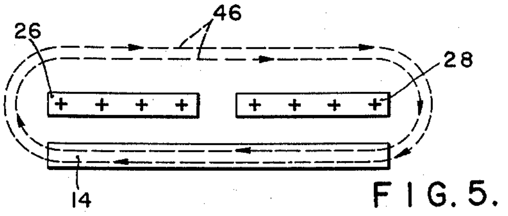

When both control members 26 and 28 are simultaneously energized, however, the associated magnetic fields 38 and 42 operate jointly on the gate element 14 to cause both gate element portions 40 and 44 to be transformed. In FIG. 5, the separate magnetic fields 38 and 42 of FIGS. 3 and 4 are shown as merging into a resultant field 46 that penetrates the gate element 14 along its entire width. Thus the transformed portions 40 and 44 merge to form a continuous resistive barrier that extends all the way across the width of the gate element 14, thereby blocking the flow of gate current. It will be noted that although for convenience the gate element has been considered as having two portions 40 and 44 which are separately transformable by magnetic fields applied selectively thereto, the gate element portions 40 and 44 have no physical boundary separating them, such as a hole. In other words, the gate element is simply connected. This is in contrast to prior art structures, which consist of two or more physically separate branches connected electrically in parallel thus forming a multiply connected region, such as a loop. It is indeed just the absence of a loop in the structure of the gate element 14 that makes it impossible to store spurious persistent currents in the gate element 14.

In order to prevent the magnetic field associated with either one of the control members from inducing transitions in the other control member while both control members 26 and 28 are energized, the directions of the two magnetic fields 38 and 42 should be such that the normal components of the fields 38 and 42 cancel each other. By normal component is meant the component of field perpendicular to the surfaces of the control members 26 and 28 and the gate element 14. The preferred magnetic field orientation may be effected by arranging the polarities of the two voltage sources 30 and 34 to direct the currents in the two control members 26 and 28 in the same direction. For example, as shown in FIGS. 4 and 5 the current in control member 28 is directed away from the observer, as is the current in control member 26, thereby establishing a magnetic field 42 directed clockwise, of which the normal component is opposite to and cancels the normal component of the other magnetic field 38, in the regions of the juncture of the gate element portions 26 and 28.

One advantage of the gating device 10 is the fact that the currents applied to the control members 26 and 28 may vary within rather wide limits. Although a certain minimum value of current is required to transform each of the gate element portions 40 and 44, substantially larger values of current can be tolerated without running the danger of transforming the entire width of the gate element 14 by current applied to only one of the control members 26 or 28. This is due to the fact that the transforming capabilities of each control member is limited to regions of the gate element 14 directly beneath and slightly to one side of the control member. Since the magnetic field is substantially reduced, in regions of the gate element 14 that are removed from the particular control member, these remote regions remain superconducting even under conditions of high control current approaching the critical current level of the control member.

Another advantage of the gating device 10 results from the open-circuit construction of the gate element 14. By avoiding the closed circuit loop construction of two or more superconductive gate elements, as in some prior art constructions, spurious supercurrents are virtually excluded from the gate circuit.

What is claimed is:

1. In combination, a thin film simply connected superconductive element including a pair of spaced terminals defining a path of current flow through said element, first magnetic field producing means mounted adjacent to said element for subjecting said element to a first magnetic field of sufficient magnitude to cause a change from the superconducting to the resistive state of a first portion of said element extending only part way across said current path but of insufficient magnitude to cause a change in state of regions of said element extending fully across said current path, second magnetic field producing means mounted adjacent to said element for subjecting said element to a second magnetic field of sufficient magnitude to cause a change from the superconducting to the resistive state of a second portion of said element adjoining said first portion and extending across said current path the remainder of the way not covered by said first portion, said second magnetic field being insufficient to cause a change in state of regions of said element extending fully across said current path, whereby only the concurrence of said first and second magnetic fields will cause a change in state of both of said portions and hence of regions of said element that extend fully across said current path.

2. In combination, a thin film simply connected superconductive element having a pair of spaced terminals defining a path of current flow through said member, a first superconductive member mounted adjacent to said element and including a pair of terminals adapted for connection to a source of control current for subjecting said element to a first magnetic field of sufficient magnitude to cause a change from the superconducting to the resistive state of a first portion of said element extending only part way across said current path but of insufficient magnitude to cause a change in state of regions of said element extending fully across said current path, a second superconductive member mounted adjacent to said element and including a pair of terminals adapted for connection to a source of control current for subjecting said element to a second magnetic field of sufficient magnitude to cause a change from the superconducting to the resistive state of a second portion of said element adjoining said first portion and extending across said current path to the extent not covered by said first portion, said second magnetic field being insufficient to cause a change in state of regions of said element extending fully across said current path, whereby only the concurrence of said first and second magnetic fields will cause a change in state of both of said portions and hence of regions of said element that extend fully across said current path.

3. In combination, a thin film simply connected superconductive gate element including a pair of spaced terminals defining a path of current flow through said element, first means mounted adjacent to said element and selectively energizable to cause a change between superconducting and resistive states of a first portion of said element that extends only part way across said current path, second means mounted adjacent to said element and selectively energizable to cause a change between superconducting and resistive states of a second portion of said element that extends only part way across said current path, said first and second portions joining together, when said first and second means are energized together, to form a resistive barrier that extends entirely across said current path.

4. The combination claimed in claim 3, wherein each of said first and second means comprises a film of superconductive material having a predetermined transition temperature, and said gate element comprises a superconductive material having a transition temperature substantially below said predetermined transition temperature.

5. The combination claimed in claim 3, wherein said first and second means comprise spaced-apart, adjacent, nonoverlapping films of superconductive material.

6. The combination claimed in claim 3, wherein each of said first and second means comprises a film of a material selected from the class consisting of lead and niobium, and said gate element comprises a film of a material selected from the class consisting of tin and indium.

7. In combination, a thin film simply connected superconductive gate element having a pair of spaced terminals defining a path of current flow through said element, first means mounted adjacent to a first portion of said element intermediate said terminals and selectively energizable to cause a change between superconducting and resistive states of regions of said element that extend only part way across said current path, second means mounted adjacent to a second portion of said element intermediate said terminals and selectively energizable to cause a change between superconducting and resistive states of regions of said element that extend only part way across said current path, said first and second means being mutually disposed in such a manner that upon concurrent energization thereof, all of said regions that are changed in state together form a resistive barrier that extends entirely across said current path.

8. The combination claimed in claim 7, wherein said first and second means comprise a pair of thin film U-shaped superconductive members mounted across said gate element, with the base of one of said U-shaped members closely spaced from the base of the other U-shaped member.

9. A superconductive gating device comprising: an elongated thin film simply connected superconductive element; an insulation film covering a major portion of said element; a first thin film superconductive member mounted on said insulation film and extending across an appreciable part of the width of said element; and a second thin film supercoductive member mounted in side-by-side, nonoverlapping, spaced-apart adjacency with respect to said first member, and extending across another appreciable part of the width of said element, said members together forming a path that extends substantially entirely across the width of said element.

10. A superconductive gating device according to claim 9, wherein said second superconductive member is mounted on said insulation film.

11. A superconductive gating apparatus comprising an elongated thin film simply connected superconductive element, an insulation film covering a major portion of said element, a first thin film superconductive member mounted on said insulation film and extending across an appreciable part of the width of said element, a second thin film superconductive member spaced from said first member and extending across another appreciable part of the width of said element, said members together forming a path that extends substantially entirely across the width of said element, and means connected to apply a current to each of said superconductive members.

12. A superconductive gating apparatus according to claim 11, wherein said means are connected to apply to said superconductive members currents that have the same direction along the length of said superconductive element.

13. A superconducting gating device comprising an elongated thin film simply connected superconductive element, a first elongated U-shaped superconductive member extending across a first portion of said element, a second U-shaped superconductive member extending across a second portion of said element, said first and second portions together forming a path that extends substantially across the entire width of said element.

14. The device claimed in claim 13, wherein said U-shaped members are oppositely oriented with respect to each other.

15. A superconductive gating device according to claim 13, wherein said element comprises a superconductive material having a predetermined transition temperature, and said members comprise superconductive material having a transition temperature substantially above said predetermined transition temperature.

References Cited in the file of this patent

UNITED STATES PATENTS

| | | |
|---|---|---|
| 2,832,897 | Buck | Apr. 29, 1958 |
| 2,892,953 | McVey | June 30, 1959 |
| 2,930,908 | McKeon et al. | Mar. 29, 1960 |
| 2,969,469 | Richards | Jan. 24, 1961 |
| 2,989,714 | Park et al. | June 20, 1961 |

OTHER REFERENCES

Alers: "Structure of the Intermediate State of Superconducting Lead," Phys. Rev. 105, 104–108, Jan. 1, 1957.

"Computerhead for 1,000 MC Operation," by Maguire, January 29, 1960, Electronics, page 58.